United States Patent [19]

Scherer

[11] 4,262,300
[45] Apr. 14, 1981

[54] MICROCIRCUIT PACKAGE FORMED OF MULTI-COMPONENTS

[75] Inventor: Jeremy D. Scherer, S. Dartmouth, Mass.

[73] Assignee: Isotronics, Inc., New Bedford, Mass.

[21] Appl. No.: 957,094

[22] Filed: Nov. 3, 1978

[51] Int. Cl.³ .................. H01L 23/02; H01L 23/12; H01L 39/02
[52] U.S. Cl. .................................. 357/74; 357/80; 357/73; 174/52 FP; 174/52 S
[58] Field of Search ............................ 357/74, 72, 73; 174/52 FP, 52 S

[56] References Cited

U.S. PATENT DOCUMENTS

| | | | |
|---|---|---|---|
| 3,340,602 | 9/1967 | Hontz | 357/74 |
| 3,374,537 | 3/1968 | Doelp | 357/80 |
| 3,404,213 | 10/1968 | Brookover | 357/74 |
| 3,408,451 | 10/1968 | Redwanz | 357/81 |
| 3,546,543 | 12/1970 | Hessinger | 357/74 |
| 3,619,734 | 11/1971 | Assour | 357/74 |
| 3,644,798 | 2/1972 | Ihochi | 357/74 |
| 3,663,868 | 5/1972 | Noguchi et al. | 357/74 |
| 3,697,666 | 10/1972 | Wakley et al. | 357/74 |
| 3,726,006 | 4/1973 | Muckelroy | 357/74 |
| 3,753,054 | 8/1973 | Johnson | 357/74 |

*Primary Examiner*—Andrew J. James
*Attorney, Agent, or Firm*—Schuyler, Banner, Birch, McKie & Beckett

[57] ABSTRACT

A multi-component microcircuit package is formed from a plurality of separate components which are secured together to form a lower package portion using a base and a continuous composite side wall frame having irregularities on its upper surface as a result of the component junctions. Secured to the top of this side wall frame is a one-piece continuous top frame member having a uniform upper surface. This top frame member covers the irregularities present in side wall frame and provides a surface more suitable for hermetic sealing of a package lid to the package.

13 Claims, 3 Drawing Figures

MICROCIRCUIT PACKAGE FORMED OF MULTI-COMPONENTS

BACKGROUND OF THE INVENTION

1. Field of the Invention

This invention relates to a multi-component microcircuit package adapted to receive an electronic microcircuit and which is particularly adapted for hermetic closure by securing a lid member thereto. The present invention also relates to the method of forming such a microcircuit package.

2. Description of the Prior Art

In the art of enclosing microcircuits in an environmentally secure package, most applications employ a rectangular or square box-like metal package having a one-piece side wall or frame mounted upon a base. Apertures in the side wall allow for passage of leads out of the package, usually through glass seals. The package is closed by sealing a lid to the upper surface of the side wall after the microcircuit substrate and associated electronics are placed inside the package. For some applications, however, especially where production quantities are small or time limits are such that the necessary tooling is not practical, manufacturers of microcircuit packages have resorted to a multi-component package construction method. In the prior art multi-component process four separate side wall metal components are assembled into a composite frame, for example, by brazing. This composite frame is employed in the same manner as the one-piece frame which is more widely used. The multi-component method can be used to make either a plug-in package or a flat package.

While the multi-component method of manufacturing all metal packages has filled a particular need as described above, there are serious problems with its application. As a result of the bonded construction, the upper surface of this package contains a number of potential irregularities at the brazed junction between the component parts. These irregularities result from the frame component mismatch and/or braze undercut. While the tolerances that can be achieved by this method are suitable to form a package for some applications, most applications involving the use of all metal packages require high reliability. For this reason, it is extremely important that the packages are able to be easily hermetically sealed. The multi-component package, with its top surface irregularities due to mismatch or brazed undercut, is very difficult to hermetically seal with a metal lid using solder. Moreover, it is virtually impossible to seal such a package by welding. Since most applications of a commercial nature require welding, use of the multi-component package method has been primarily limited to prototype purposes.

Thus, it would be of great value to the art if one were to produce a microcircuit package having the flexibility, ease of manufacture, and low cost of the multi-component package construction and the reliability of hermetic closure of the one-piece frame construction.

SUMMARY OF THE INVENTION

It is, therefore, an object of the present invention to provide a multi-component microcircuit package which can be produced quickly and inexpensively without high tooling costs.

Another object of the prsent invention is to provide a multi-component microcircuit package which can be economically produced in small quantities according to particular desgn specifications.

It is also an object of the present invention to provide a multi-component microcircuit package which has a smooth uniform upper bonding surface to which a lid can be easily and reliably hermetically sealed.

In accordance with these and other objects the present invention provides a method for forming a multi-component microcircuit package from a plurality of separate members comprising the steps of providing a lower package portion having a base and a continuous, composite side wall frame, said side wall frame being formed from at least two separate side wall members which are secured to one another in such a way that the upper surface of the composite side wall frame has at least one side wall member-to-side wall member junction; and securing a one-piece, continuous top frame member to the top surface of the composite side wall frame, the top frame member providing a uniform upper surface onto which a package lid may be hermetically sealed.

The present invention further relates to a multi-component microcircuit package comprising a lower package portion having a base and a continuous, composite side wall frame formed from at least two separate side wall members and having at least one side wall member-to-side wall member junction located on the top surface of the composite side wall frame; and a one-piece continuous top frame member secured to the top surface of said composite side wall frame, the top frame member providing a uniform upper surface onto which a package lid may be hermetically sealed.

DESCRIPTION OF THE INVENTION

Figure 1:
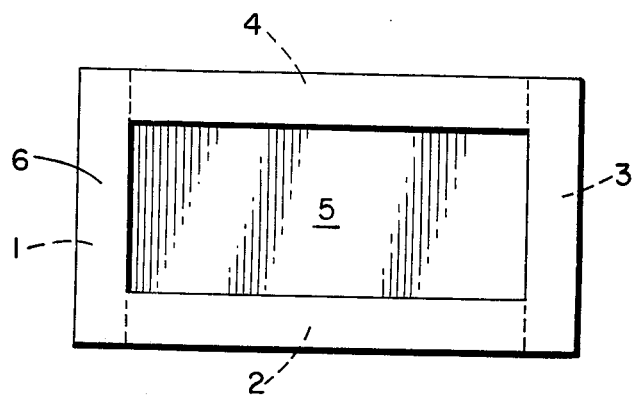
FIG. 1 is a top view of a multi-component microcircuit package according to the present invention.
Figure 2:
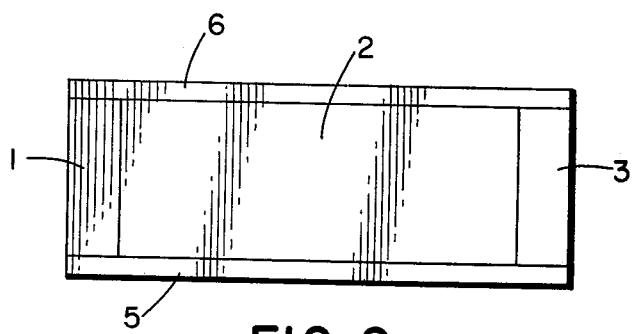
FIG. 2 is a side view of the package shown in FIG. 1.

The first step in the process of forming the microcircuit package of the present invention comprises providing a lower package portion. In the embodiment shown in FIGS. 1 and 2 this lower package portion is essentially rectangular in shape and consists of four side wall members 1, 2, 3 and 4 secured to one another to form a composite frame which is secured to a base member 5. An important feature of this type of package construction is the flexibility it provides. In selecting a suitable lower package portion according to this invention the only requirement is that it have at least one irregular area on the upper surface of the composite frame formed by securing the side wall members together.

While the shape is shown in the drawings as rectangular, it is, of course, readily apparent to one of ordinary skill in the art that any particular shape employed in the microcircuit industry may be utilized. The exact dimensions of the package similarly may be selected with the view towards the application in which the package is employed. As described above, the flexibility inherent in the multi-component system allows for construction of packages to any given dimensional requirements.

In addition, it is not necessary that the lower package portion be formed from five separate component parts as shown in the drawing. As indicated above, the only requirement is that there be at least one bonded junction on the upper surface of the composite frame. Thus, the lower package portion could be formed by two L-shaped side wall members and a base which were secured together to form a box-like structure. Similarly, one or more of the side wall members may be integrally formed with the base.

The exact structural configuration of the lower package portion will, of course, depend on its application. In general, this multi-component construction technique is applicable to plug-in packages or flat packages. The flat package, as well known in the art, will contain a plurality of apertures in the side wall members for the metallic leads. In the manner known in the art, these holes may be drilled in the separate side wall members or in the frame after it has been assembled.

The present invention finds greatest utility in the area of all metal packages. Typically, these packages are formed from KOVAR or cold rolled steel although stainless steel and other similar metals may be employed. It is, of course, not necessary that all components of the package portion be formed from the same metal. If different materials are employed, however, care should be taken to insure that the coefficients of thermal expansion of the materials are approximately equal in the temperature range being used. Thus, if desired packages with special metal bases may be employed. In the case of all metal packages, the junction between the component parts is usually affected by brazing. A typical brazing composition useful in assembling a KOVAR composite frame comprises copper. Other brazing compositions tailored to the particular metals involved are known to those skilled in the art. The temperatures at which these materials are employed is also well known in the art.

The present invention also finds utility in speciality applications where nonmetals are employed in the base, such as ceramics. Among the ceramic base materials which may be employed are alumina and beryllia.

Figure 3:
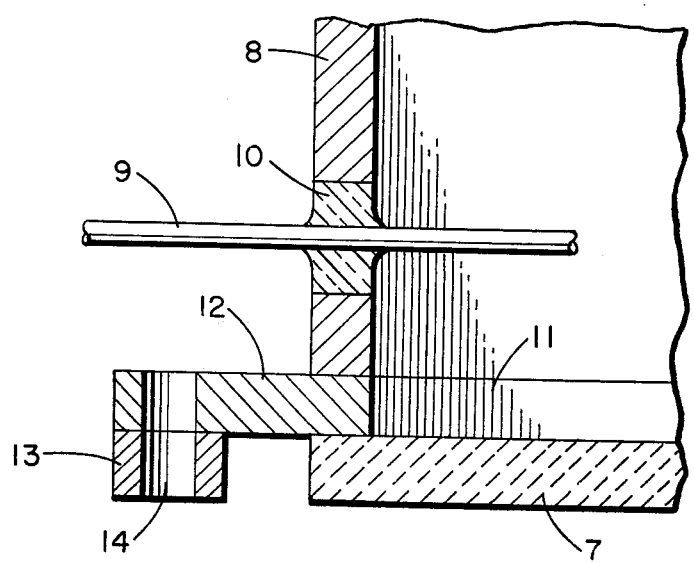
FIG. 3 is a partial side view of a base detail of one embodiment of the present invention.

FIG. 3 shows a partial side view of another type of lower package portion adapted for a special application. This figure shows a package portion having a ceramic base member 7 and a metallic side wall 8. A lead 9 is shown passing through glass seal 10. The base and side wall are connected by a metallic mounting ring 11 having an integral flange portion 12 which is supported by a boss 13. The package assembly can be bolted down through predrilled holes 14 in the flange/boss arrangement. This particular embodiment is just one of many of the types of lower package portions which can be employed according to the process and apparatus of the present invention.

The second step in forming the multi-component microcircuit package of the present invention comprises securing a one-piece continuous top frame member to the top surface of the composite side wall frame. This top frame member has a uniform upper surface which facilitates the hermetic sealing of a lid to the package by conventional techniques.

The top frame member is preferably metallic. For most applications, the top frame member may be made of the same metal as the side wall members, e.g., KOVAR. Dissimilar metals, however, may be employed as long as they can be secured together and have matched thermal coefficients of expansion.

The top frame member may be secured to the top surface of the composite frame side wall in any conventional manner. For most applications brazing is preferred. As indicated above, brazing compositions and temperatures useful for suitable metals are well known.

The top frame member is preferably provided in a size and shape which is substantially congruent to the upper surface of the continuous composite side wall frame. Thus, in the embodiment shown in FIGS. 1 and 2 of the drawing, this top frame member 6 is a picture frame-shaped member. It will be recognized, of course, that the top frame member may extend beyond the side wall frame width or even may be somewhat narrower than the side wall frame width as long as a uniform upper sealing surface for the lid is provided.

The following example is included for illustrative purposes only and is not intended to limit the scope of the invention.

EXAMPLE

This example demonstrates the technique of the present invention in the manufacture of a simple rectangular multi-component microcircuit package. The overall dimensions of the finished package are $3'' \times 3'' \times 0.250''$ high. The lower package portion is formed from four rectangular side wall members made of 0.050'' thick KOVAR which are brazed together to form a box-like composite frame member open at the top and bottom. The box-like member is then brazed to the metallic base member. In the final step of the process a metallic top frame member which is a one-piece picture frame shaped member is secured to the upper surface of the side wall again by brazing. The top frame member is made of 0.020'' thick KOVAR which had been previously chemically milled to provide precise dimensions and surface uniformity.

While certain specific embodiments of the invention have been described with particularity herein, it should be recognized that various modifications thereof will occur to those skilled in the art. Therefore, the scope of the invention is to be limited solely by the scope of the claims appended hereto.

I claim:

1. A hermetically sealable multi-component microcircuit package comprising:
   (a) a lower package portion having a base and a continuous composite side wall frame, said composite side wall frame comprising at least two separate side wall members secured together in such a manner that the top surface of said composite side wall frame has at least one side wall member-to-side wall member junction; said junction irregularities in said top surface and
   (b) a one-piece, continuous top frame member secured to the top surface of said side wall frame, said top frame member providing a uniform upper surface onto which a package lid may be hermetically sealed.

2. The package of claim 1 wherein said side wall members are made of metal.

3. The package of claim 1 wherein said base is made of metal.

4. The package of claim 2 wherein said side wall members are secured to one another by brazing.

5. The package of claim 1 wherein said base is made of ceramic material.

6. The package of claim 1 wherein said base is integrally formed with at least one of said side walls.

7. The package of claim 1 wherein said side wall frame is provided with at least one aperture through which lead wire can pass.

8. The package of claim 1 wherein said top frame member is made of metal.

9. The package of claim 1 wherein said top frame member is substantially congruent to the top surface of said side wall frame.

10. The package of claim 8 wherein said top frame member is secured to the top surface of said side wall frame by brazing.

11. The package of claim 8 wherein said top frame member is chemically milled to provide said uniform upper surface.

12. The package of claim 8 wherein said top frame member is stamped out to provide said uniform upper surface.

13. A hermetically sealable all metal, multi-component flat microcircuit package comprising:
  (a) a lower package portion having a metallic base brazed to a continuous composite side wall frame, said composite side wall frame being formed by brazing a plurality of metallic side wall members together, the top surface of said side wall frame having at least one brazed junction thereon; and
  (b) a one-piece continuous metallic top frame member brazed to the top surface of said side wall frame to provide a uniform top surface onto which a package lid may be hermetically sealed.

* * * * *